United States Patent
Christenson et al.

(10) Patent No.: US 6,274,506 B1
(45) Date of Patent: Aug. 14, 2001

(54) APPARATUS AND METHOD FOR DISPENSING PROCESSING FLUID TOWARD A SUBSTRATE SURFACE

(75) Inventors: Kurt K. Christenson; Steven L. Nelson, both of Minnetonka, MN (US)

(73) Assignee: FSI International, Inc., Chaska, MN (US)

(*) Notice: Subject to any disclaimer, the term of this patent is extended or adjusted under 35 U.S.C. 154(b) by 0 days.

(21) Appl. No.: 09/312,409

(22) Filed: May 14, 1999

(51) Int. Cl.$^7$ ........................................... H01L 21/00
(52) U.S. Cl. ..................... 438/748; 156/345; 134/34; 134/31; 216/91; 216/92; 438/704; 438/706
(58) Field of Search ..................... 438/704, 706, 438/748, 749, 980; 134/2, 30, 31, 32, 34, 37; 216/91, 92; 156/345 LS

(56) References Cited

U.S. PATENT DOCUMENTS

| | | |
|---|---|---|
| 932,898 | 8/1909 | Place . |
| 1,149,254 | 8/1915 | Dumars . |
| 2,876,188 | 3/1959 | Thorp et al. . |
| 3,555,783 | 1/1971 | Grimshaw . |
| 3,590,902 | 7/1971 | Walker et al. . |
| 3,650,151 | 3/1972 | Drexel . |
| 3,653,182 | 4/1972 | Welch . |
| 3,921,002 | 11/1975 | Williams et al. . |
| 4,051,886 | 10/1977 | Ross . |
| 4,105,725 | 8/1978 | Ross . |
| 4,172,786 | 10/1979 | Humphrey et al. . |
| 4,176,206 | 11/1979 | Inoue . |
| 4,220,460 | 9/1980 | Partus . |
| 4,276,243 | 6/1981 | Partus . |
| 4,393,013 | 7/1983 | McMenamin . |
| 4,507,253 | 3/1985 | Wiesmann . |
| 4,540,531 | 9/1985 | Moy . |
| 4,632,789 | 12/1986 | Reid . |
| 4,666,480 | 5/1987 | Mann . |

(List continued on next page.)

FOREIGN PATENT DOCUMENTS

| | | |
|---|---|---|
| 2142630 | 8/1996 | (CA) . |
| 0 430 904 | 11/1989 | (EP) . |
| 0 380 962 | 8/1990 | (EP) . |
| 0 550 152 | 7/1993 | (EP) . |
| 0 712 692 | 5/1996 | (EP) . |
| 1 545 559 | 5/1979 | (GB) . |
| 60-114393 | 6/1985 | (JP) . |
| 62-221426 | 9/1987 | (JP) . |
| 1-130785 | 5/1989 | (JP) . |
| 1-257103 | 10/1989 | (JP) . |
| 1306787 | 12/1989 | (JP) . |
| 3-089995 | 4/1991 | (JP) . |
| 3-154690 | 7/1991 | (JP) . |
| 3-274722 | 12/1991 | (JP) . |
| 4-346895 | 12/1992 | (JP) . |

(List continued on next page.)

*Primary Examiner*—William Powell
(74) *Attorney, Agent, or Firm*—Kagan Binder, PLLC

(57) ABSTRACT

A centrifugal spray processor for dispensing a stream of ozonated water toward one or more semiconductor wafers at a non-parallel angle that is inclined from the plane of the surface of the semiconductor wafer. The spray processor includes one or more supports for receiving a plurality of semiconductor wafers and a spray post for dispensing ozonated water from a reservoir onto the semiconductor wafers. The spray post includes a plurality of nozzles that are configured to dispense ozonated water at a generally downward angle toward the surface of the semiconductor wafer. The angle of incidence of the stream of ozonated water from the spray post as measured from the plane of the semiconductor is greater than 0 degrees, and is preferably greater than about 0 degrees and less than or equal to about 30 degrees depending upon the configuration of the spray post and the semiconductor wafers.

22 Claims, 4 Drawing Sheets

U.S. PATENT DOCUMENTS

| | | |
|---|---|---|
| 4,735,750 | 4/1988 | Damann . |
| 4,874,509 | 10/1989 | Bullock . |
| 4,900,336 | 2/1990 | Pittner et al. . |
| 5,014,727 | 5/1991 | Aigo . |
| 5,032,217 * | 7/1991 | Tanaka ................................... 216/91 |
| 5,082,518 | 1/1992 | Molinaro . |
| 5,100,521 | 3/1992 | Schwarzl . |
| 5,186,841 | 2/1993 | Schick . |
| 5,246,556 | 9/1993 | Sawamoto et al. . |
| 5,378,317 | 1/1995 | Kashiwase et al. . |
| 5,431,861 | 7/1995 | Nagahiro et al. . |
| 5,460,705 | 10/1995 | Murphy et al. . |
| 5,464,480 | 11/1995 | Matthews . |
| 5,624,734 | 4/1997 | Rees et al. . |
| 5,756,054 | 5/1998 | Wong et al. . |
| 5,879,576 * | 3/1999 | Wada et al. ........................ 216/92 X |

FOREIGN PATENT DOCUMENTS

| | | |
|---|---|---|
| 6-120192 | 4/1994 | (JP) . |
| 6-182366 | 7/1994 | (JP) . |
| 6277476 | 10/1994 | (JP) . |
| 8-45886 | 2/1996 | (JP) . |
| WO 96/01593 | 1/1996 | (WO) . |
| WO 97/26308 | 7/1997 | (WO) . |
| 98/28107 | 7/1998 | (WO) . |
| WO 98/46340 | 10/1998 | (WO) . |

* cited by examiner

APPARATUS AND METHOD FOR DISPENSING PROCESSING FLUID TOWARD A SUBSTRATE SURFACE

TECHNICAL FIELD

The present invention is a spray tool and method for dispensing a processing fluid toward a substrate surface, such as a semiconductor wafer. More particularly, the present invention is a spray processor for dispensing ozonated water toward a surface of a semiconductor wafer, the tool having a nozzle configured to dispense the ozonated water at an angle relative to a plane containing the surface of the wafer that is impacted by the ozonated water.

BACKGROUND OF THE INVENTION

Ozone has long been recognized as a useful chemical commodity valued particularly for its outstanding oxidative activity. In fact, ozone is the fourth strongest oxidizing chemical known, having an oxidation potential of 2.07 volts. Because of this property, ozone and/or fluid mixtures including ozone are capable of removing a wide variety of contaminants, such as for example cyanides, phenols, and detergents, from surfaces. Also, ozone and/or fluid mixtures including ozone are capable of oxidizing surfaces. In particular, ozonated water is used to "clean", i.e., oxidize, the surface of silicon wafers in-process in the semiconductor industry. Additionally, ozone is also useful for inhibiting, reducing and/or eliminating the accumulation of undesired materials, such as biomass, mold, mildew, algae, fungi, bacterial growth and scale deposits in various aqueous solution systems. When used in this manner, ozonation provides the advantage of producing a lesser quantity of potentially harmful residues than, e.g., chlorination, which leaves undesirable chlorinated residues in aqueous systems.

Because of this wide range of activity, ozone finds application in many diverse processes. Ozone, for example, has been used as a biocide for the treatment of drinking water. Additionally, ozone is used for sterilization in the brewing industry, and for odor control purposes in the sewage treatment industry. Ozonated water also finds wide utility in the semiconductor industry, where for example, ozone is used to clean and surface condition in-process silicon wafers. Additionally, as is described in U.S. Pat. No. 5,378,317, ozonated water is used to remove organic materials, such as photoresist, from the surface of silicon wafers. Moreover, ozonated water is used in the semiconductor industry to form a thin, passivating oxide layer on the surface of silicon wafers.

The use of ozonated water provides several advantages in these applications. First of all, because ozonated water is generated at the point of use, it is relatively free of contaminants, i.e., particles and metals, that are typically present in chemicals that are stored in barrels or drums. Ozonated water is also less expensive than other oxidizing chemicals and furthermore, since ozonated water naturally decomposes, the use of ozonated water presents few disposal issues. However, the effectiveness of ozone in each of these applications is adversely affected by its low solubility and short-half life (approximately 10 minutes) in aqueous solutions. That is, not only is it difficult to dissolve ozone in an aqueous solution, but also, once dissolved, it is difficult to maintain the ozone in solution.

Several methods of increasing the quantity of dissolved ozone in aqueous solutions are known. For example, bubbling ozone directly into water at ambient pressure has been used as a method to dissolve ozone in aqueous solutions. Additionally, published European patent application No. EP 0 430 904 A1 discloses a process for producing ozonated water comprising the step of contacting, within a vessel of defined volume, an ozone-containing gas with fine droplets of water. Methods utilizing cooling to increase the quantity of dissolved ozone in aqueous solutions have also been proposed. For example, U.S. Pat. No. 5,186,841 discloses a method of ozonating water comprising injecting ozone through an aqueous stream across a pressure drop of at least 35 psi. The ozonated stream is then combined with a second stream that is preferably a portion of an aqueous solution which is recirculating in a cooling water system. The resultant stream is forced to flow at a velocity of 7 feet per second for a distance sufficient to allow 70% of the ozone to be absorbed. Additionally, U.S. Pat. No. 4,172,786 discloses a process for increasing the quantity of dissolved ozone in an aqueous solution by injecting an ozone containing gas into a side stream conduit which circulates a portion of cooling water. The ozone-injected water is then mixed with the cooling water in a tower basin, thereby ozonating the water. Finally, U.S. Pat. No. 5,464,480 discloses a process for removing organic materials from semiconductor wafers using ozonated water. Specifically, this patent teaches that high ozone concentration water, suitable for use in the disclosed process may be obtained by mixing ozone and water at a temperature of from about 1° C. to 15° C.

An improved method for increasing and maintaining the quantity of ozone dissolved in a liquid is described in commonly assigned U.S. Pat. No. 5,971,368, the entire disclosure of which is incorporated by reference in its entirety for all purposes. The '277 application discloses a pressurized vessel into which a stream of gas, such as ozone, is introduced to contact and dissolve in an amount of liquid, such as ultrapure deionized water, and an outlet that dispenses a stream of the ozonated liquid under sufficiently gentle conditions such that an increased quantity of ozone dissolved in the liquid stream is dispensed.

Spray processing tools and methods for dispensing a stream of liquid used to clean a substrate surface are well known and in use in the a variety of industries, including the semiconductor industry. For example, the MERCURY® centrifugal spray processor, commercially available from FSI International, Chaska, Minn., includes a horizontal turntable that supports one or more semiconductor wafers and a vertical spray post that dispenses one or more processing chemicals. The processor includes vertical supports on the turntable for supporting semiconductor wafer cassettes. The spray post is fluidly coupled to one or more reservoirs containing the chemical(s) to be dispensed, and includes one or more nozzles positioned on the spray post out of which each chemical is dispensed. The chemical exits the spray post nozzle in a direction that is perpendicular to the vertical spray post and parallel to the horizontal turntable. The processing chemical impacts the one or more semiconductor wafers supported by the turntable to carry out the desired treatment. The turntable can be rotated independent of the spray post to distribute the stream of processing chemical over the semiconductor wafer. Such a processing tool is advantageously used, for example, to strip photoresist from the semiconductor wafer. The use of ozonated water for such a photoresist stripping application is widely used due to the oxidative qualities of ozone described above.

The strip rate in such an application is dependent not only on the ozone content in the liquid stream, but it is also strongly dependent upon the flow rate of the ozonated water over the substrate processed by the stream of ozonated water, i.e. the semiconductor wafer. This suggests that increasing the flow rate of the ozonated water over the substrate to be processed should improve the strip rate of the ozonated water. One method for increasing the flow of ozonated water over the substrate surface is to increase the rate at which the stream of ozonated water is dispensed from the spray post. As described above, however, it can be difficult to maintain the concentration of ozone dissolved in a liquid, and the conditions under which the ozonated water is dispensed can directly affect the concentration of the ozone in the liquid stream. Accordingly, increasing the flow of ozonated water from an ozonated water generation system (such as is described above) typically reduces the concentration of ozone in the ozonated water stream. This, in turn, can negatively impact the strip rate rather than increasing the strip rate as is desired.

Thus, there is a continuing need for a more efficient processing tool and method of dispensing a stream of processing fluid, such as ozonated water, at a point of use. In particular, a tool and method that increases the efficiency of the processing fluid, such as for example a tool and method that increases the strip rate of the ozonated water, would be especially advantageous.

SUMMARY OF THE INVENTION

The present invention advantageously provides an approach for more efficiently processing a surface of a substrate with a processing fluid. The principles of the present invention described above and in more detail below advantageously increase the efficiency by which a processing fluid is used, which accordingly decreases the amount of time it takes to process a substrate surface. For example, in an application where a stream of ozonated water is used to strip photoresist from a semiconductor wafer, the present invention provides for an increased amount of ozonated water to be applied to a surface to be processed, and provides an increased effective flow rate of the ozonated water across the wafer surface than is presently achievable without significant adverse effect, if any, on the concentration of the ozone in the stream of ozonated water. The increased amount of ozonated water and the increased effective flow rate of the ozonated water enhances the efficiency of the stripping process, which reduces the amount of time necessary to remove the photoresist from the wafer, thus improving the overall efficiency of the semiconductor preparation process.

In a first aspect of the present invention, a spray processor is used to process a surface of a semiconductor wafer. The spray processor includes a nozzle that is fluidly coupled to a source of processing fluid. The nozzle dispenses the processing fluid toward a surface of one or more semiconductor wafers. The stream of processing fluid is dispensed at a nonparallel angle from the plane containing the surface(s) of the semiconductor wafer(s). The spray processor can include a rotatable turntable that directly or indirectly supports the one or more semiconductor wafers, and the nozzle can be positioned on a spray post that is located near the center of the turntable. In such an embodiment, the stream of ozonated water is generally directed toward an inner edge of the semiconductor wafer that is nearest the spray post as the wafer passes through the stream of processing fluid. The processor can include a plurality of nozzles, which can be positioned on the spray post, each of which dispenses a stream of processing fluid toward one or more semiconductor surfaces at an angle that is inclined from the plane of the semiconductor wafer surface(s). The angle of incidence of each of the streams can be greater than 0 degrees and less than 90 degrees, with a preferred range of angles being greater than 0 degrees and less than or equal to about 30 degrees. Even more preferably, the range of incidence angles can be greater than or equal to about 5 degrees and less than or equal to about 20 degrees The angle at which a stream of fluid is dispensed from a given nozzle can be substantially the same, or different as desired, as the angle of each of the other streams of processing fluid dispensed by the other nozzles.

Alternatively, instead of positioning the nozzle on a central spray post, the nozzle of the spray processor can be positioned adjacent a rotating turntable on which a semiconductor wafer is supported. In such an embodiment, one or more semiconductor wafers can be positioned over the axis of rotation of the turntable, and the stream of processing fluid is dispensed at an incidence angle to impact the wafers at a point generally near the edge of the wafer with sufficient momentum to carry the fluid to a point on the wafer near the axis of rotation of the turntable. As with the embodiment described above, a plurality of nozzles can be provided, which can be positioned on a spray post, and each of which dispense a stream of processing fluid that is inclined at an angle relative to the plane of the surface(s) of one or more semiconductor wafer(s). The angle of each stream of fluid dispensed by the nozzles can be different or can be substantially the same as the angle of the other streams of fluid.

In either such embodiment, the processing fluid can advantageously comprise ozonated water, such as for removing photoresist from a surface of the semiconductor wafer.

Another aspect of the invention is a method for dispensing ozonated water toward a substrate surface for processing the substrate surface. The method includes the steps of providing a substrate having a surface that exists in a plane and causing a stream of ozonated water to be dispensed toward the plane containing the substrate surface at an angle that is inclined from the plane of the surface. In one embodiment, the method includes providing one or more semiconductor wafers that are received and supported by a spray processor, the processor having a rotatable turntable and a nozzle that is fluidly coupled to a source of ozonated water. The angled stream of ozonated water is dispensed from the nozzle toward the surface of the semiconductor wafer. The turntable can be rotated to move the semiconductor wafer into and through the stream of ozonated water, and the nozzle can be positioned as desired for a specific application. For example, the nozzle can be positioned on a spray post, and the spray post can be located over the center of the turntable. The stream of ozonated water can then be dispensed to impact the surface of the semiconductor wafer at a point near an edge of the semiconductor wafer adjacent the spray post. The rotation of the turntable thus distributes the ozonated water across the surface of the semiconductor wafer. Alternatively, the spray post can be positioned adjacent the turntable and the semiconductor wafer can be positioned over the axis of rotation of the turntable. In such an embodiment, the stream of ozonated water is directed to impact the semiconductor wafer at a point generally near the edge of the wafer with momentum sufficient to carry the ozonated water to a point on the wafer near the axis of rotation of the turntable so that the rotation will distribute the ozonated water across the surface of the wafer.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF THE PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The present invention can be used to dispense a processing fluid toward a substrate in an application wherein the desired effect caused by the processing fluid on the substrate depends, at least in part, upon the flow rate of the processing fluid over the substrate surface. The present invention is particularly advantageous in an application where simply increasing the rate at which the processing fluid is dispensed either negatively impacts the efficacy of the processing fluid or increases costs. For the purposes of illustration, the principles of the present invention will be described in connection with the dispensing of one or more streams of ozonated water toward one or more semiconductor wafers to strip photoresist from a surface of each of the one or more semiconductor wafers. It is contemplated, however, that the principles described herein can be used to dispense ozonated water for any number of processing applications, or to dispense any processing fluid toward a surface of a substrate, particularly when the interaction between the processing fluid and the substrate surface is dependent at least in part upon the flow rate of the fluid over the surface.

Figure 1:
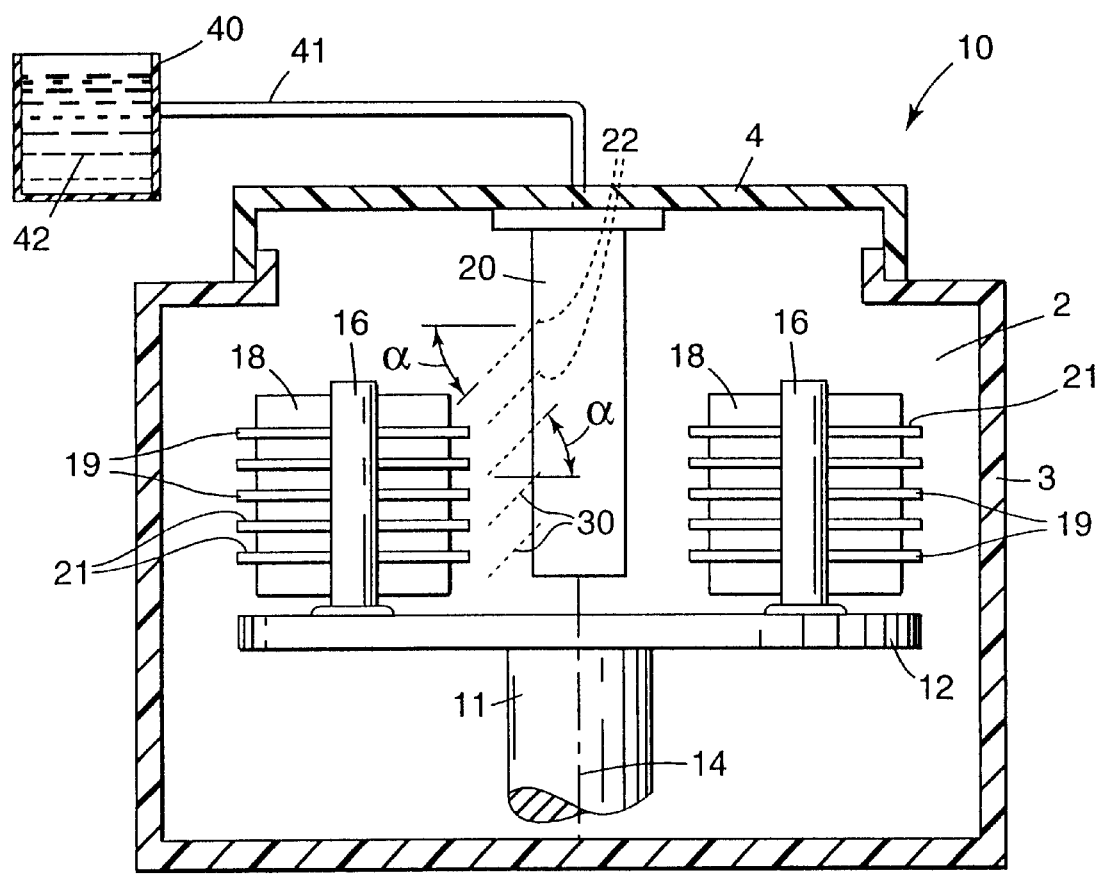
FIG. 1 is a schematic side view of a centrifugal spray processor having a center spray post in accordance with the present invention for dispensing processing fluid at a semiconductor wafer surface.
Figure 2:
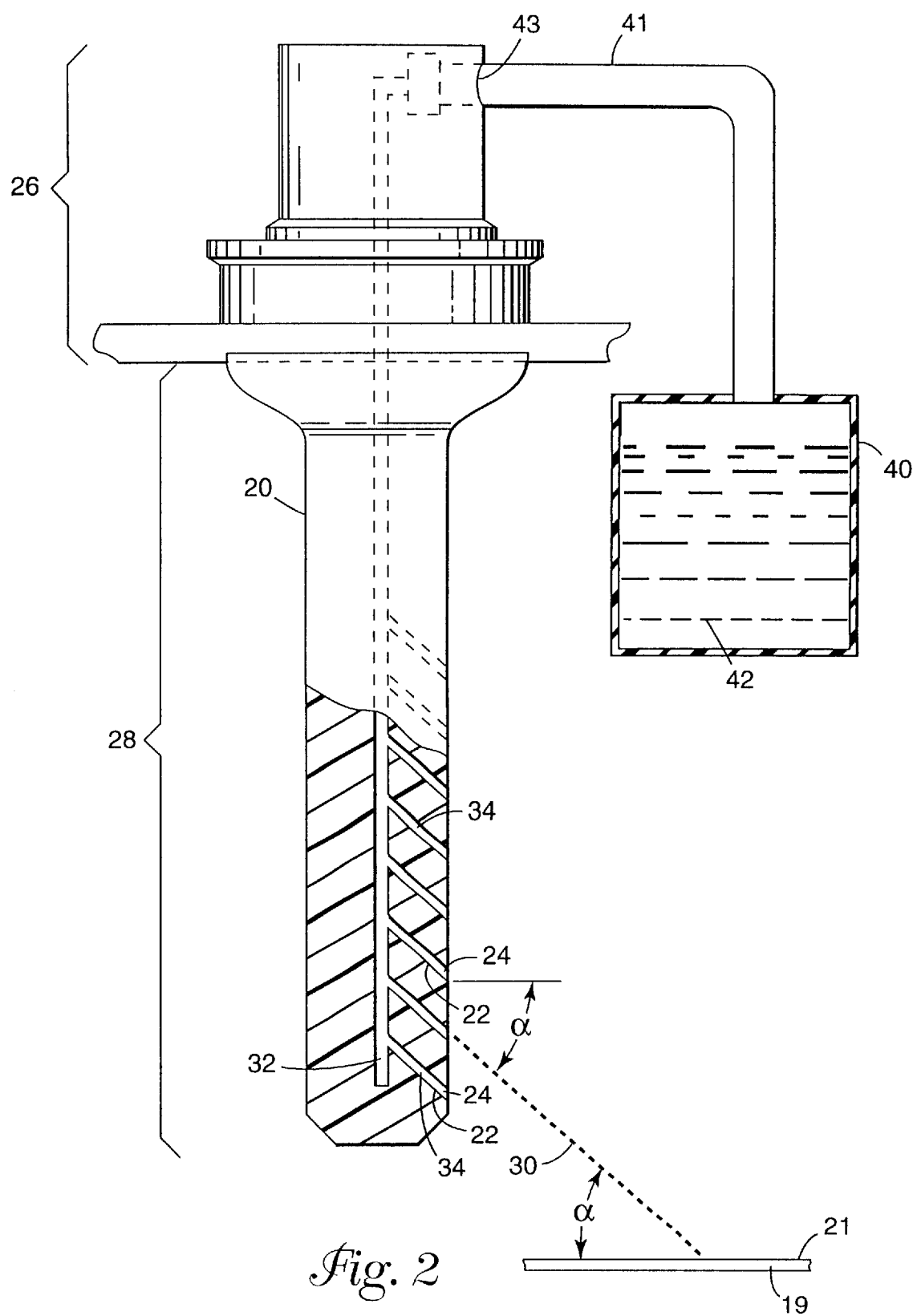
FIG. 2 is a side view of spray post with portions broken away to illustrate the nozzles of the spray post.

Referring now to FIGS. 1 and 2, a centrifugal spray processor 10 in accordance with the present invention is shown. Spray processor 10 includes processing chamber 2 defined by housing 3 and lid 4. A turntable 12 is rotatably mounted in processing chamber 2 upon shaft 11 such that turntable 12 is rotatable about axis 14 of shaft 11. Processor 10 can include a support, such as one or more uprights 16, that are adapted to receive one or more semiconductor wafers 19. In the embodiment shown, semiconductor wafers 19 are supported in cassettes 18, which are received by uprights 16. Other structures for supporting semiconductor wafers 19 can of course be used.

Processor 10 further includes a spray post 20, which is fluidly coupled to a reservoir 40 containing a processing fluid 42 (e.g. ozonated water in this embodiment). In practice, ozonated water is typically generated on demand, and thus reservoir 40 can comprise an ozonator though which deionized water is passed in order to dissolve ozone in the water. In the embodiment shown, spray post 20 is attached to lid 4 of processor 10, and is positioned near the axis 14 of turntable 12. In this manner, turntable 12 (and thus cassettes 18 and semiconductor wafers 19) rotate around axis 14 independently of the spray post 20. Spray post 20 delivers processing fluid 42 onto wafers 19 through one or more nozzles 22 on spray post 20 which, as is shown, are fluidly connected to reservoir 40 through supply line 41. Of course, spray post 20 can be fluidly connected to one or more additional reservoirs of processing liquids, if desired.

More particularly, during wafer processing, the turntable 12 and cassettes 18 containing semiconductor wafers 19 rotate about the axis of shaft 14 as processing fluid 42 is sprayed on the wafers 19. The rotation of the cassettes 18 and the centrifugal forces generated by the rotation help to distribute the chemical solutions over the surface of the semiconductor wafers 19. This technique, referred to as "centrifugal spray processing," is commonly used to condition wafer surfaces at different stages in the semiconductor device manufacturing process. One such application of centrifugal spray processing is the stripping of photoresist on a semiconductor wafer surface. In such an application, ozonated water generated by any of the means described above in the Background section is preferably used due to the strong oxidative qualities of ozone.

The rate at which the photoresist on the wafer surface is removed is dependent upon the effective rate at which the ozonated water flows over the surface of wafers 19. In a conventional processing application, a stream of processing fluid, such as ozonated water, is dispensed from a nozzle, such as for example in a centrifugal spray processor, in a direction parallel to the semiconductor wafer surface. In such an application, the ozonated water is directed over both major surfaces of the semiconductor wafers. The rotation of the turntable on which the wafers are supported helps to distribute the ozonated water over both major surfaces of the semiconductor wafers. As described in greater detail below, however, this is often an inefficient use of the processing fluid, particularly when it is desired to process only one major surface of each of the semiconductor wafers.

The processor 10 of the present invention provides for increased effective flow rate of one or more streams 30 of ozonated water over the semiconductor wafers 19 with a more focused and beneficial distribution of the ozonated water over the surface of semiconductor wafers 19 specifically desired to be impacted by the ozonated water. For example, in a photoresist stripping application, photoresist is typically only present on one side of a semiconductor wafer 19. The present invention focuses the application of the stream 30 of ozonated water by directing a substantial portion of stream 30 to the surface of wafer 19 to be processed (i.e. the surface containing the photoresist) rather than to both surfaces of semiconductor 19. As described in greater detail below, the focused application of stream 30 of ozonated water on the surface of semiconductor wafer 10 provides a greater effective flow rate of ozonated water across the surfaces of the wafers 19, without actually increasing the real flow rate of ozonated water discharged through the nozzle. This can increase the rate at which the photoresist is stripped from the surfaces of the wafers 19 without loss of ozone content that would tend to result with an increased real flow rate.

More particularly, and as perhaps best seen in FIG. 2, spray post 20 includes a plurality of nozzles 22 that each include an orifice 24 through which a stream 30 of ozonated water is dispensed. Each nozzle 22 and its orifice 24 is configured to dispense stream 30 of ozonated water at an incidence angle of α toward surfaces 21 of semiconductor wafers 19 that contain photoresist (and are thus desired to be processed) rather than in a direction parallel to the semiconductor wafers 19, as is commonly used in the semiconductor industry. That is, as compared to the plane in which the surface of the semiconductor wafers 19 are located, the stream of ozonated water 30 is dispensed from the orifice 24 of one of the plurality of nozzles 22 at incidence angle of α. In this manner, the stream 30 impacts the surface of wafers 19 at incidence angle α. As used herein, incidence angle refers to the smaller of the two angles between the substrate surface (e.g. the surface 21 of a wafer 19 that is impacted by the ozonated water) and the stream of processing fluid (e.g. the stream 30 of ozonated water). While FIGS. 1 and 2 show a spray processor 10 having a spray post 20 with a plurality of nozzles 22, each of which dispense an independent stream 30 of ozonated water at the same incidence angle α, it is contemplated that any nozzle 22 and its orifice 24 can be configured to dispense a stream 30 of ozonated water at an incidence angle that is different from the incidence angles at which the streams of ozonated water are dispensed from one or more of the other nozzles and orifices of the spray processor.

In the present embodiment, spray post 20 includes a mounting flange portion 26 that is coupled to processor 10, such as through lid 4 as shown in FIG. 1, and a nozzle portion 28. The plurality of nozzles 22 are distributed along a length of nozzle portion 28, and are fluidly coupled to a source 40 of ozonated water 42 through a longitudinal passage 32 that extends along a length of spray post 20. Longitudinal passage 32 can be fluidly coupled to supply line 41 at input 43 at the flange portion 26 of spray post 20 to receive ozonated water 42 from reservoir 40 in a conventional manner.

The orifice 24 of each nozzle 22 is configured to dispense ozonated water in a stream 30 that is inclined at the incidence angle α (e.g. inclined from horizontal in a typical embodiment). In the embodiment shown in FIG. 1, orifice 24 of nozzle 22 comprises a passage 34 connected to longitudinal passage 32 that is angled from the plane parallel to the surface of wafers 19 to be impacted by the desired incidence angle α. Given the generally vertical nature of spray post 20 in FIG. 1, this plane is also thus perpendicular to the longitudinal axis of the spray post 20. In this manner, a stream 30 of ozonated water is dispensed from nozzle 22 at the desired incidence angle α and impacts surface 21 of wafers 19 at the incidence angle α.

Each nozzle 22 and its orifice 24 are preferably adapted to dispense the ozonated water under sufficiently gentle conditions to maximize the amount of ozone remaining in the stream 30 of ozonated water after discharge from nozzle 22. For example, it has been found that minimizing the ratio of surface area to volume of a stream of ozonated liquid helps to maintain the quantity of ozone in the stream of liquid to the desired point of use (i.e. the surface of the wafers 19). The nozzles 22 are thus configured in such a manner that the stream 30 of ozonated water dispensed from a given nozzle 22 comprises a flow of ozonated water having a low ratio of surface area to volume. See, for example, commonly assigned and co-pending U.S. Pat. No. 5,971,368, the disclosure of which has been incorporated herein by reference.

It is contemplated that streams 30 of ozonated water dispensed by nozzles 22 can comprise any kind of flow of ozonated water, such as a continuous stream of fluid, an atomized stream of fluid, or any combination thereof. In the embodiment shown in FIG. 2, orifice 24 of each nozzle 22 is configured to eject a continuous stream 30 of ozonated water. That is, the configuration of passage 34 coupled to passage 32 in spray post 20 will create a continuous, preferably cylindrical stream 30 of ozonated water fluid, which is presently preferred due to the low surface area to volume ratio of such a stream and the simplicity of generating such a stream of processing fluid. Alternatively, the stream of ozonated water dispensed from any given nozzle can comprise an appropriately atomized spray of ozonated water having a low ratio of surface area to volume in the droplets of the atomized spray. Such an atomized spray can be created by a nozzle having two or more orifices, through each of which a flow of ozonated water is directed in such a manner that the flows impact each one another to cause atomization of the flows, and thus create the atomized stream of ozonated water. A spray post having a triad of orifices for creating and gently dispensing a stream of atomized ozonated water is described in commonly assigned U.S. Pat. No. 5,971,368, the disclosure of which has been incorporated herein by reference. It is further contemplated that nozzles 22 can be configured as a spray jet, a fan jet, or a combination thereof, as desired by a specific application.

While processor 10 is shown in use with a spray post 20 that includes a plurality of nozzles 22, it is contemplated that one or more nozzles coupled to reservoir 40 of processing fluid 42 can also be used in addition to or independent of spray post 20. That is, a plurality of nozzles that are integrated into a spray processor, such as for example by being mounted directly to the side of the housing or extending from the lid over the semiconductor wafers, can be used to dispense a stream of processing fluid in accordance with the principles of the present invention.

In a representative embodiment, a Mercury® spray processor commercially available from FSI International of Chaska, Minn. was modified to dispense a plurality of streams 30 of ozonated water from a spray post 20 at an incidence angle α. In this example, thirty four individual nozzles 22 were positioned on the spray post 20, each nozzle being spaced approximately 0.25 inches apart from a neighboring nozzle 22 in the longitudinal direction along a length of nozzle portion 28 of spray post 20. This spacing between the individual nozzles 22 corresponds to a preferred spacing of 0.25 inches between a plurality of 8 inch semiconductor wafers 19 supported in cassettes 18. Spacing the nozzles 22 from one another by the same amount as the spacing of the wafers 19 provides better registration between the individual streams 30 of ozonated water and the individual wafers 19 in that a single stream 30 can be specifically aimed at a specific wafer 19. The spacing between nozzles can also advantageously be one-half of the spacing between individual wafers 19, which provides for two streams 30 to contact a specific wafer 19. While two representative spacings for nozzles 22 are described herein, the nozzles 22 can, of course, be spaced as desired for a given application.

The orifice 24 of each nozzle 22 was created to be circular in cross-sectional area having a diameter of 0.07 inches. The nozzles 22 were configured to dispense ozonated water at an incidence angle of 20 degrees, although other angles, e.g. 30 degrees, have been found to provide satisfactory performance.

In such an embodiment, 14 liters per minute of ozonated water was dispensed through the thirty four nozzles 22 of spray post 20, which equates to a discharge of ozonated water from each individual nozzle 22 at approximately 2.75 meters per second. This flow rate of ozonated water substantially removed a 1.0 micron thick layer of photoresist, such as TOK-2450-6cP type photoresist commercially available from OHKA America Inc., Doylestown Pa. 18901, from the surfaces 21 of semiconductor wafers 19 in approximately 900 seconds. This strip time represents a 40% improvement over a spray processor where streams of ozonated water were dispensed by a spray post at an incidence angle of 0 degrees (i.e. substantially parallel to the semiconductor wafers 19).

While specific dimensions and flow rates for the spray processor 10 are provided above, it is to be understood that other configurations and applications for processor 10, including the dimensions of the components and the operating parameters of the processor, can be used without departing from the spirit and scope of the present invention.

Figure 3:
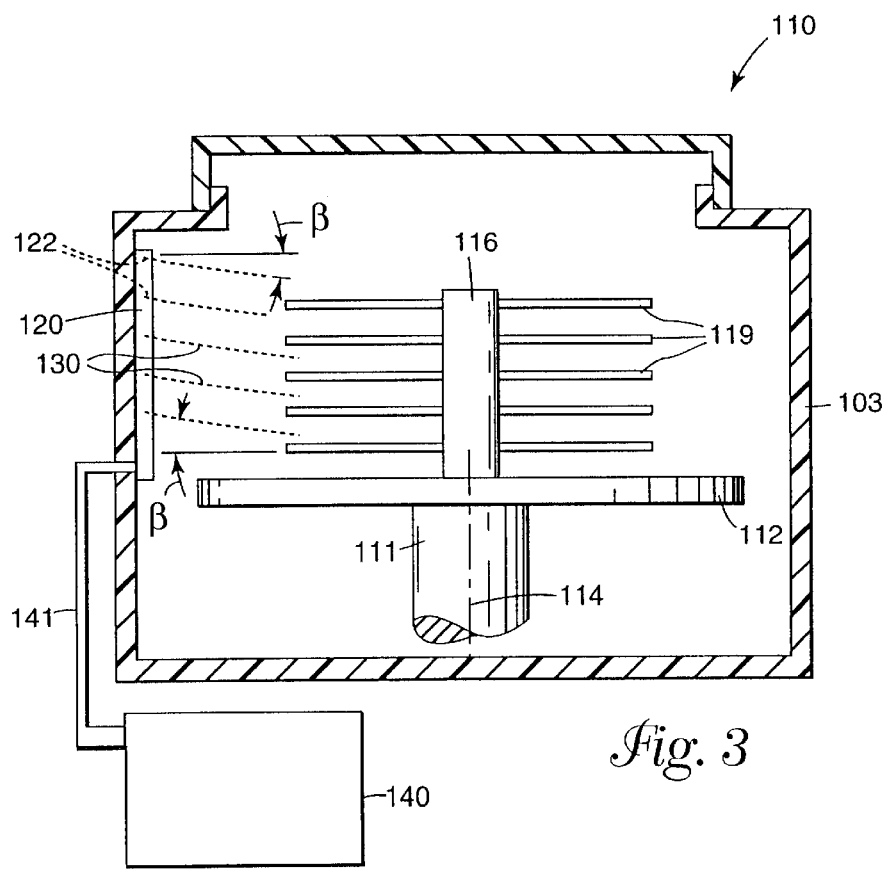
FIG. 3 is a schematic side view of a centrifugal spray processor having a side spray post in accordance with the present invention for dispensing processing fluid at a semiconductor wafer surface.

FIG. 3 illustrates an alternative spray processor 110 in accordance with the principles of the present invention. Many of the features of spray processor 110 are similar to the features shown in FIG. 1 and described above, with such features designated with similar reference numbers incremented by 100. Spray processor 110 includes a turntable 112 rotatably mounted to shaft 111 having an axis of rotation 114. Semiconductor supports, such as uprights 116 (only one of which is visible in FIG. 3), are adapted to receive a plurality of semiconductor wafers 119. Spray processor 110 includes a side spray post 120 that is mounted to the side of housing 103 of processor 110 and that is fluidly coupled to reservoir 140 through supply line 141.

Side spray post 120 can be used to dispense one or more streams 130 of ozonated water from reservoir 140 to provide "on-center" application of ozonated water to semiconductor wafers 119 wherein the ozonated water is carried via its momentum to a point near the center of the semiconductor wafers 119. In such an application, the wafers 119 are supported by uprights 116 and are positioned over the axis 114 of rotation of turntable 112. Nozzles 122 of spray post 120 dispense a plurality of streams 130 of ozonated water at an incidence angle β that is inclined to be non-parallel relative to the plane of the surfaces of wafers 119. While each of the plurality of streams 130 of ozonated water are each shown as being dispensed at the same incidence angle β as the other streams 130, the nozzles 122 of processor 110 can be configured to dispense one or more of streams 130 at a different incidence angle than one or more of streams 130 if desired.

Streams 130 of ozonated water are preferably applied to the wafers at a region at or near the edge of the wafers 119 with sufficient momentum to carry the ozonated water near the axis of rotation 114 of the turntable 112. That is, the nozzles 122 of spray post 120 are configured to aim the streams 130 of ozonated water generally toward the edge portion of the wafers 119, and by dispensing the streams 130 at the incidence angle β, sufficient momentum is imparted to the ozonated water to carry the ozonated water to a point on the wafers that is at or near the axis 114 of turntable 112. In a preferred embodiment, wafers 1 19 are positioned on turntable 112 such that the center of the wafers is located over axis 114, and streams 130 are thus carried via the dispensation momentum toward the center of wafers 119.

To provide momentum sufficient to carry the ozonated water of streams 130 to the axis of rotation 114, the incidence angle β of a given stream 130 may be shallower than the incidence angle α in an application where a center spray post is used (such as is shown in FIG. 1 and described above), particularly when it is necessary to direct one or more streams 130 between a series of stacked wafers 119.

That is, the incidence angle β is relatively shallow to allow the momentum of the streams 130 to carry the ozonated water to the center regions of the stacked wafers 119. By directing the stream 130 of ozonated water to such a point and permitting the momentum of the stream 130 carry the ozonated water to a position near the point of rotation of wafers 119 (i.e. the center of the semiconductor wafers 119), the centrifugal forces created by the rotating turntable 112 can more evenly distribute the ozonated water over the surfaces of the wafers 119. This in turn enhances the efficiency of the etching of the photoresist (or other processing step) from the surface of the semiconductor wafers.

In such an application where the streams 130 of ozonated water are aimed to impact at or near the edge of the wafers 119 with sufficient momentum to carry the ozonated water to a region on the wafers 119 near the axis 114 of rotation, the speed at which the turntable 112 rotates should be controlled to prevent the centrifugal forces generated by the rotating turntable 112 from being sufficiently large to prevent the transport of the ozonated water from the edge of wafers 119 to the desired point by the momentum of streams 130. It is also contemplated that the streams 130 can be aimed to impact the region of the wafers 119 near the axis 114, in which case the rotation of the turntable 112 will be less critical to the proper delivery of the ozonated water.

In a representative example, processor 110 can be configured in such a manner that the incidence angle β at which any one of the streams 130 of ozonated water is dispensed is greater than 0 degrees and less than 90 degrees, and more preferably ranges between greater than 0 degrees and 30 degrees. Even more preferably, the incidence angle for an on-center application is greater than or equal to 1 degree and less than or equal to 5 degrees from the plane of the semiconductor wafers 119. Twenty nine individual nozzles 122 were provided on side pray post 120, each having a circular orifice through which ozonated water is dispensed that is 0.070 inches in diameter. The nozzles 122 were spaced 10 millimeters apart from each other, which corresponds to a preferred spacing between a stack of twelve inch semiconductor wafers 119. As described above in connection with processor 10, matching the spacing of the nozzles 122 with the spacing of the wafers 119 advantageously provides good registration between an individual stream 130 of ozonated water and a specific wafer 119, although the nozzles 122 can be spaced as desired for a desired application.

The nozzles 122 were configured to dispense ozonated water at an incidence angle of about 2 degrees. Fourteen liters per minute of ozonated water was dispensed through the twenty nine nozzles 122 of spray post 120, which equates to a discharge of ozonated water from each individual nozzle 122 of about 3.25 meters per second. Revolution speeds ranging between 10 and 100 revolutions per minute have been found to be acceptable. In such an embodiment, a 0.7 inch thick layer of photoresist was substantially removed from the surfaces of wafers 119 in 960 seconds.

Figure 4:
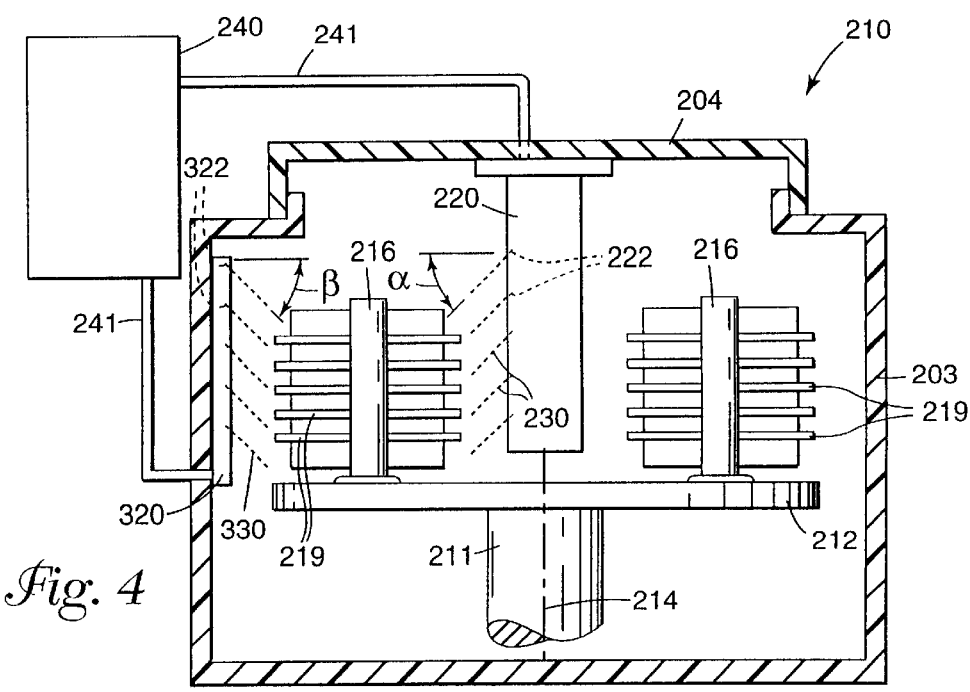
FIG. 4 is a schematic side view of a centrifugal spray processor having a side spray post and a center spray post in accordance with the present invention for dispensing processing fluid at a semiconductor wafer surface.

Another embodiment of a spray processor 210 in accordance with the present invention is schematically illustrated in FIG. 4. Many of the features of spray processor 210 are similar to the features of spray processor 10 shown in FIG. 1 and described above, with such features designated with similar reference numbers incremented by 200. Spray processor 210 includes a turntable 212 rotatably mounted to shaft 211 having an axis of rotation 214. Semiconductor supports, such as uprights 216, are adapted to receive a plurality of semiconductor wafers 219, which can be supported by cassettes 218. Spray processor 210 includes both a center spray post 220 mounted to lid 204 and positioned over the center of turntable 212, and a side spray post 320 mounted to the side of housing 203, each of which are fluidly coupled to a reservoir 240 through supply lines 241, and which can respectively dispense angled streams 230 and 330, respectively, of ozonated water from reservoir 240. That is, streams 230 are dispensed from nozzles 222 of spray post 220 at an incidence angle $\alpha$ relative to the surface of the semiconductor wafers 219, and streams 330 are dispensed from nozzles 322 of spray post 320 at an incidence angle $\beta$ relative to the surface of the semiconductor wafers 219.

The incidence angles $\alpha$ and $\beta$ of streams 230 and 330 can be optimized to fit a desired application. More particularly, $\alpha$ and $\beta$ can be the same or they can be different, depending on the number and the position of the wafers 219 on the turntable 212. Moreover, while a plurality of streams 230 dispensed at the same incidence angle $\alpha$ is shown in FIG. 4, it is contemplated that any stream 230 can be dispensed at a different incidence angle than the other streams 230. Similarly, any of the streams 330 can be dispensed at the same or different incidence angles $\beta$ as the other streams 330.

Figure 5:
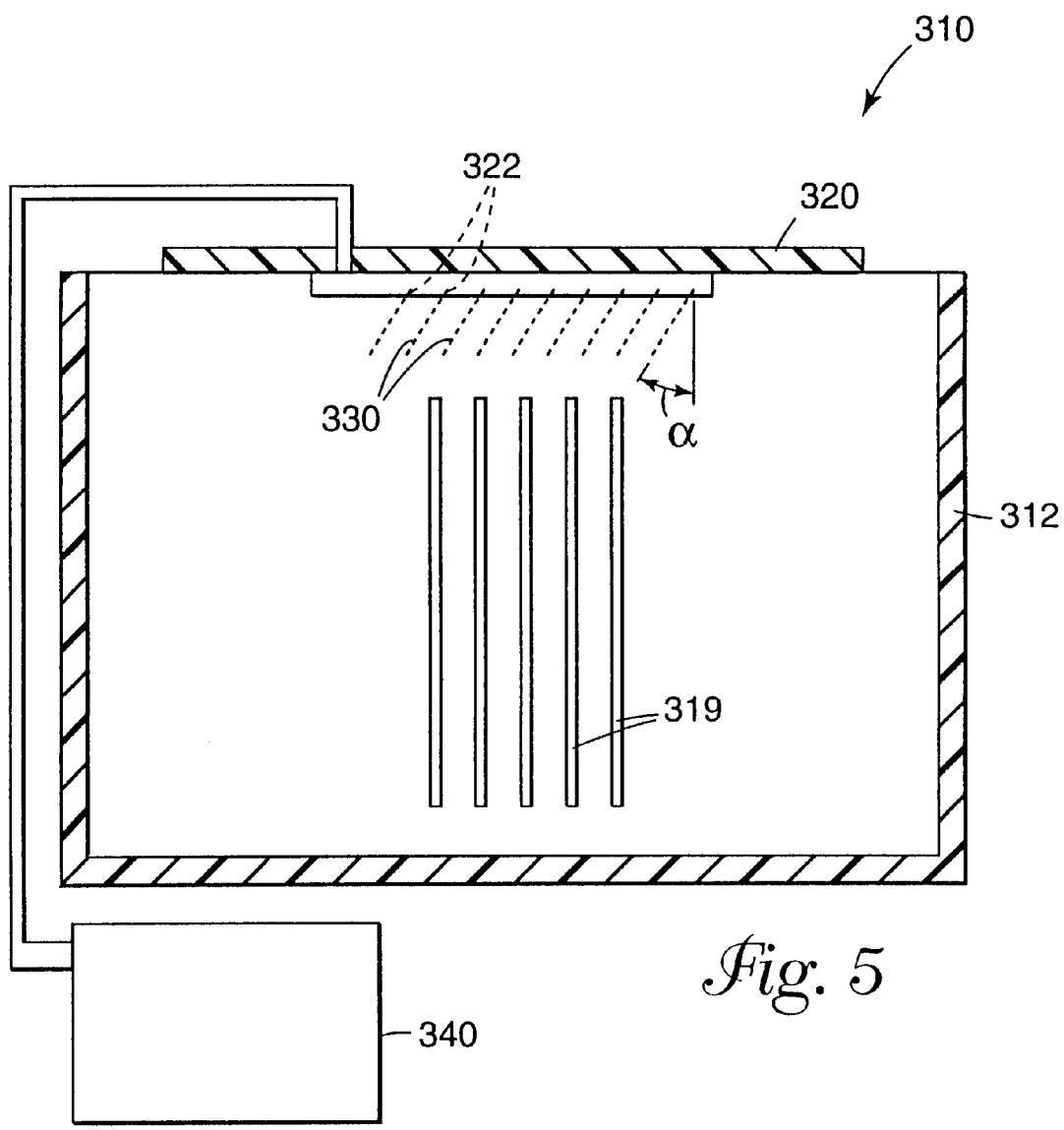
FIG. 5 is a schematic side view of an immersion type wet bench processor in accordance with the present invention for dispensing processing fluid toward a semiconductor wafer surface.

Another embodiment of a processor 310 is shown in FIG. 5. Processor 310 includes a vessel 312 that is suitably sized so as to be capable of enclosing one or more semiconductor wafers 319 for processing. Alternatively, vessel 312 can be configured as an open bath for receiving semiconductor wafers for processing. A spray post 320 having a plurality of nozzles 322 is fluidly coupled to reservoir 340 of ozonated water, and spray post 320 is positioned to dispense a stream 330 of ozonated water each of the nozzles 322. In accordance with the principles of the present invention, nozzles 320 are sized and positioned to dispense stream 330 of ozonated water toward a surface of wafers 319 in a direction that is non-parallel and inclined from the surface of wafers 319 by an incidence angle $\alpha$. The incidence angle $\alpha$ of any stream 330 can be the same or it can be different as desired for a particular application. The nozzles 322 of processor 310 can be configured as spray jets to help distribute the streams 330 of ozonated water over the surface of wafers 319. Alternative methods for aiding the distribution of ozonated water can also be used, including translation of the spray post 320 along its longitudinal axis, rotation of the spray post 320 about its longitudinal axis, translation of the wafers 319, or rotation of the wafers 319.

The dispensing of the stream of ozonated water from a nozzle at an incidence angle measured relative to the surfaces of the semiconductor wafers, as shown in the different embodiments of FIGS. 1–5 and described above, provides significant advantages over previous spray processors and methods for dispensing a processing fluid toward a substrate surface. Recall that conventionally, ozonated water is dispensed from a spray processor in a direction parallel to the semiconductor wafer surfaces supported by the spray processor. In such an application, the ozonated water is directed toward and flows over both major surfaces of entire semiconductor wafers. In an application such as stripping photoresist from a single surface of the semiconductor wafer, directing ozonated water to flow over both major surfaces of the semiconductor wafers is inefficient in that a portion of the ozonated water does not contact any photoresist. Moreover, directing the ozonated water toward a surface that does not have photoresist necessarily reduces the amount of ozonated water that is directed toward the surface containing the photoresist. The reduced amount of ozonated water applied to the surface desired to be processed reduces the efficacy of the ozonated water, due in large part to the reduced amount of ozonated water flowing over the surface to be processed. In addition, the velocity of the flow of ozonated water in such an application over the wafer surfaces can vary considerably as the flow moves over the wafers, and it can be difficult to control the distribution of the ozonated water over a semiconductor wafer, partially due to the uprights that support the wafer cassettes, which as mentioned above in connection with the on-center spray processor 110 shown in FIG. 2 block a portion of the stream of ozonated water. It can also be difficult to evenly distribute ozonated water across the wafer since the centrifugal forces caused by the rotating turntable will force the ozonated water on the surface of the wafers away from the point of application and toward the outer edges of the wafer.

A spray processor in accordance with the principles of the present invention as described above overcomes these shortcomings in that a more direct application of the stream of processing fluid is generated. That is, in the example described, dispensing streams of ozonated water at an angle of incidence relative to the surface of a semiconductor that is desired to be processed provides a more focused, and thus beneficial application, of ozonated water to the surfaces of the semiconductor wafers. Substantially all of the ozonated water will be directed to the desired surface to be processed through the dispensing the stream of ozonated water at an angle of incidence, which will in turn increase the amount of ozonated water that contacts the desired surfaces of the semiconductor wafers as compared to conventional processors. A greater amount of ozonated water applied to the surface will increase the rate at which photoresist is stripped due to the greater amount of ozone placed in contact with the layer of photoresist.

It is also believed that increasing the mass of the ozonated water on the surfaces of the wafers advantageously increases the effective flow rate of the ozonated water across the surface of the wafer, particularly in an application where centrifugal forces are used to distribute the ozonated water across the semiconductor wafer. The centrifugal forces generated by the rotating turntable generally cause the processing fluid applied to the wafer surfaces to "sheet" across the surfaces of the wafer. An increase in the mass of ozonated water applied to a wafer surface, however, such as is provided by the present invention, will create a greater "sheeting" action of the ozonated water across the surfaces of the wafers. That is, by applying a greater amount ozonated water to a desired point of application on the semiconductor wafers, a higher effective flow rate of the ozonated water across the surfaces of the wafers can be generated as the centrifugal forces experienced by the wafers distributes the ozonated water. Applying the ozonated water at an incidence angle relative to the surfaces of the semiconductor wafers thus increases the effective flow rate of the ozonated water across the surface of the wafers, which increases the rate at which the photoresist on the wafer surface is removed by the ozonated water as compared to conventional processors. This in turn leads to a more efficient overall wafer manufacturing process.

In an application where a center spray post is used, such as is illustrated in FIG. 1, the stream 30 of ozonated water from each nozzle 22 can be aimed to contact the semiconductor wafers 19 at or just over edges of the wafers 19 nearest the axis of rotation 14 of the turntable 12. The centrifugal forces generated by the rotation will help distribute the ozonated water away from this point of application and over the surface of the wafer 19. In applications where both a side spray post and a center spray post are used, the point of application of the stream 30 of ozonated water can be optimized independently for each post as desired.

It is contemplated that the incidence angle α and or β, as the case may be, be greater than 0 degrees and less than 90 degrees as measured from the plane of the semiconductor surface, and the incidence angles α and or β can be optimized as necessary for a desired application. As described above, an incidence angle of between 0 degrees and 30 degrees has been found to produce increased photoresist stripping, with an incidence angle of 20 degrees being presently preferred, in a center spray post application such as is shown in FIG. 1. In an on-center spray post application, such as is shown in FIG. 3, a shallower incidence angle is preferred so as to be able to direct the stream of ozonated water toward the wafers with sufficient momentum to carry the ozonated water to the point of rotation of the wafers. An incidence angle β of approximately 2 degrees is presently preferred for such an application.

As is described in commonly assigned application entitled "METHOD FOR TREATING A SUBSTRATE WITH HEAT SENSITIVE AGENTS" identified by U.S. Ser. No. 09/312,775, currently co-pending, and filed concurrently with the present application, the entire disclosure of which is incorporated by reference in its entirety for all purposes, processors in accordance with the principles of the present invention and described above can also advantageously be used with one or more streams of an additional processing fluid that contacts the surface of the wafers. This second processing fluid is preferably heated to a temperature above that of the first processing fluid to raise the temperature of the semiconductor wafers. The second processing fluid can be directed to a surface of the semiconductor opposite that surface that is impacted by the inclined stream of the first processing fluid (e.g. the surface not containing the photoresist in a photoresist stripping application). Heating the semiconductor surface with the second processing fluid can improve the efficiency of the processing step performed by the processor.

Although the present invention has been described with reference to preferred embodiments, workers skilled in the art will recognize that changes may be made in form and detail without departing from the spirit and scope of the invention.

What is claimed is:

1. A spray processor for dispensing a fluid toward a surface of one or more semiconductor wafers for processing the semiconductor wafers, the spray processor comprising a nozzle fluidly coupled to a source of processing fluid and through which a stream of processing fluid is dispensed toward a surface of a semiconductor wafer at an angle that is inclined from a plane containing the surface of the semiconductor wafer, said angle being in the range of from greater than about 0 degrees to about 30 degrees.

2. The spray processor of claim 1, the processor further including a rotatable turntable on which the one or more semiconductor wafers are supported; and wherein the nozzle is mounted on a spray post, the spray post positioned near the center of the turntable, the turntable adapted to rotate independent of the spray post.

3. The spray processor of claim 2, wherein the one or more wafers are positioned proximal to an outer periphery of the turntable and wherein the nozzle of the spray post is positioned to aim the stream of processing fluid generally toward an inner edge of each of the one or more semiconductor wafers.

4. The spray processor of claim 3, wherein the processor includes a plurality of nozzles positioned on the spray post, each nozzle dispensing a stream of processing fluid toward respective surfaces of the one or more semiconductor wafers at an inclined angle relative to respective planes containing the surfaces of the semiconductor wafers.

5. The spray processor of claim 4, wherein the processing fluid is ozonated water.

6. The spray processor of claim 5, wherein each of the angles at which the streams of ozonated water are dispensed is substantially the same.

7. The spray processor of claim 6, wherein the angle at which the streams of ozonated water are dispensed toward a surface of a semiconductor wafer is about 20 degrees.

8. The spray processor of claim 1, the processor further including a rotatable turntable on which the one or more wafers are supported, and wherein the nozzle is positioned on a spray post, the spray post positioned adjacent the turntable with the nozzle directing the stream of processing fluid over the one or more semiconductor wafers supported on the turntable.

9. The spray processor of claim 8, wherein the turntable is mounted to a shaft about which the turntable rotates and over which the one or more semiconductor wafers are supported, and further wherein the nozzle of the spray post is positioned to aim the stream of processing fluid generally toward an edge of the wafers with sufficient momentum to carry the processing fluid to a point of the one or more semiconductor wafers positioned over the rotating shaft.

10. The spray processor of claim 9, wherein the processor includes a plurality of nozzles positioned on the spray post, each nozzle dispensing a stream of processing fluid toward a surface of the one or more semiconductor wafers at an inclined angle relative to a plane containing the surface of the semiconductor wafer.

11. The spray processor of claim 10, wherein the processing fluid is ozonated water.

12. The spray processor of claim 11, wherein the angles at which the streams of ozonated water is dispensed is greater than about 0 degrees and less than or equal to about 30 degrees.

13. The spray processor of claim 12, wherein each of the angles at which each of the streams of ozonated water are dispensed are substantially the same.

14. The spray processor of claim 13, wherein the angle at which the streams of ozonated water are dispensed is about 2 degrees.

15. A spray processor for dispensing a fluid toward a plurality of semiconductor wafers held in the spray processor in a stacked relationship and having respective surfaces to be processed, the spray processor comprising a plurality of nozzles located outside of said stacked wafers and being fluidly coupled to a source of a processing fluid and through which a respective plurality of streams of the processing fluid are dispensed at an inclined angle from the surfaces.

16. A method for dispensing ozonated water toward a substrate surface for processing the substrate surface, the method comprising the steps of:

provide a substrate having a surface to be processed that exists in a plane; and causing a stream of ozonated water to be directed toward the surface at an angle that is inclined from the plane containing the surface, the stream of ozonated water impacting the surface at the angle to process the surface of the substrate.

17. The method of claim 16, wherein:

the step of providing a substrate includes providing a semiconductor wafer received and supported by a spray processor having a rotatable turntable and a nozzle, the nozzle fluidly coupled to a source of ozonated water, the semiconductor wafer having a surface that exists in a plane; and the step of causing a stream of ozonated water to be directed to a surface of a substrate includes dispensing ozonated water from the nozzle toward the surface of the semiconductor wafer.

18. The method of claim 17, further including the step of rotating the turntable to move the semiconductor wafer into and through the stream of ozonated water.

19. The method of claim 18, wherein the spray post is positioned near the center of the turntable, the stream of ozonated water being dispensed to impact a point near an edge of the semiconductor wafer adjacent the spray post, the rotation of the turntable and the semiconductor wafer distributing the ozonated water across the surface of the wafer.

20. The method of claim 18, wherein the spray post is positioned adjacent the turntable and the center of the semiconductor wafer is positioned over the axis of rotation of the turntable, the stream of ozonated water being dispensed to impact a region near the edge of the wafer with momentum to carry the ozonated water to a portion of the semiconductor wafer near the axis of rotation of the turntable, the rotation of the turntable and the semiconductor wafer distributing the ozonated water across the surface of the wafer.

21. The method of claim 18, wherein the stream of ozonated water removes a layer of photoresist on the surface of the semiconductor wafer.

22. A method for removing photoresist from a semiconductor wafer, comprising the steps of:

loading a semiconductor wafer into a spray processor, wherein a surface of the wafer includes the photoresist, and wherein the spray processor includes a nozzle fluidly coupled to a source of a processing fluid, the nozzle being disposed relative to the wafer to dispense the processing fluid onto the wafer surface at angle that is inclined from the surface, said angle being in the range of from greater than about 0 degrees to about 30 degrees; and dispensing a stream of the processing fluid from the nozzle toward the surface of the semiconductor wafer such that the processing fluid impacts the surface of the semiconductor wafer at the inclined angle to strip photoresist from the surface of the semiconductor wafer.

\* \* \* \* \*